(12) United States Patent
Prause et al.

(10) Patent No.: US 9,177,699 B2
(45) Date of Patent: Nov. 3, 2015

(54) METHOD FOR PRODUCING A SUPERCONDUCTING WIRE, IN PARTICULAR USING LEAD-FREE SOLDER

(71) Applicant: Bruker EAS GmbH, Hanau (DE)

(72) Inventors: Burkhard Prause, Gruendau (DE); Manfred Thoener, Biebergemuend (DE); Andreas Szulczyk, Linsengericht (DE)

(73) Assignee: Bruker EAS GmbH, Hanau (DE)

( * ) Notice: Subject to any disclaimer, the term of this patent is extended or adjusted under 35 U.S.C. 154(b) by 56 days.

(21) Appl. No.: 14/031,058

(22) Filed: Sep. 19, 2013

(65) Prior Publication Data

US 2014/0100117 A1    Apr. 10, 2014

(30) Foreign Application Priority Data

Oct. 5, 2012 (DE) .......................... 10 2012 218 250

(51) Int. Cl.
*H01B 12/02* (2006.01)
*H01L 39/14* (2006.01)
*H01L 39/24* (2006.01)

(52) U.S. Cl.
CPC ................ *H01B 12/02* (2013.01); *H01L 39/14* (2013.01); *H01L 39/2403* (2013.01)

(58) Field of Classification Search
CPC ............ H01L 39/2403; H01L 39/2406; H01L 39/2409; H01B 12/10; H01B 12/14
See application file for complete search history.

(56) References Cited

U.S. PATENT DOCUMENTS

| 4,554,407 A * | 11/1985 | Ceresara et al. ............ 174/125.1 |
| 7,089,647 B2 * | 8/2006 | Hentges et al. ................. 29/599 |
| 2008/0163474 A1* | 7/2008 | Hong et al. ...................... 29/599 |
| 2010/0222222 A1* | 9/2010 | Mito et al. ...................... 505/150 |

FOREIGN PATENT DOCUMENTS

| DE | 35 27 714 | 2/1987 |
| EP | 0 147 512 | 7/1985 |
| GB | 1 130 464 | 10/1968 |

OTHER PUBLICATIONS

"NbTi for MRI application" Bruker EAS GmbH, Hanau, Germany, 2012.

* cited by examiner

*Primary Examiner* — Colleen Dunn
(74) *Attorney, Agent, or Firm* — Paul Vincent

(57) ABSTRACT

A method for producing a superconducting wire (10), wherein an internal wire (1), which contains superconducting filaments (4), is provided with a normally conducting stabilizing structure (9), is characterized in that, in a continuous or quasi-continuous process, one or more sheath elements (2; 2a, 2b) are shaped and/or placed around the internal wire (9), so that the entire circumference of the internal wire (1) is enclosed by one or more sheath elements (2; 2a, 2b), and all seams (6; 6a, 6b; 16; 16a, 16b) of sheath element ends (5a-5d; 15a-15d) facing each other are soldered and/or welded. A method for producing a superconducting wire is thereby provided, which restricts the cross section of the superconducting wire to a lesser extent and which permits the use of lead-free solder.

19 Claims, 6 Drawing Sheets

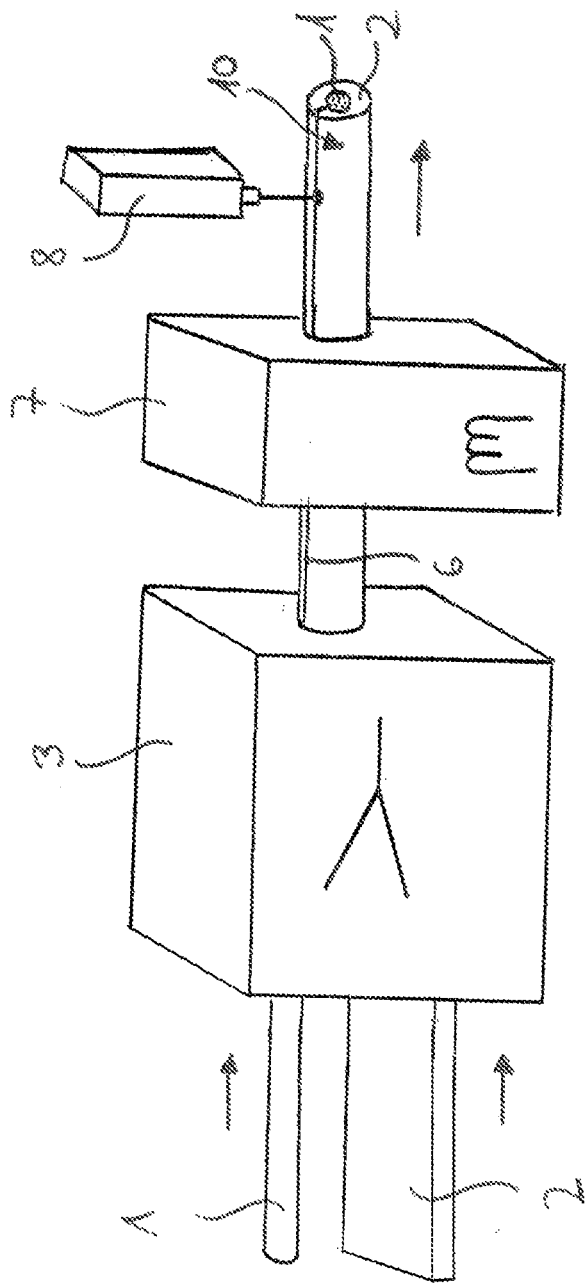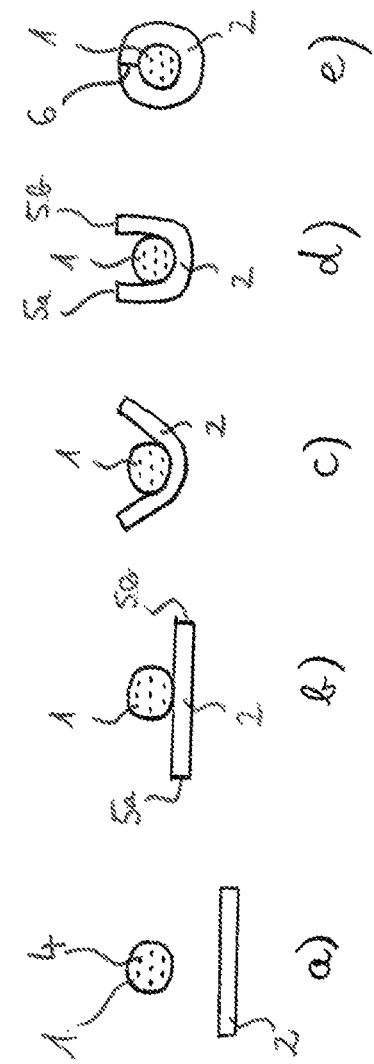

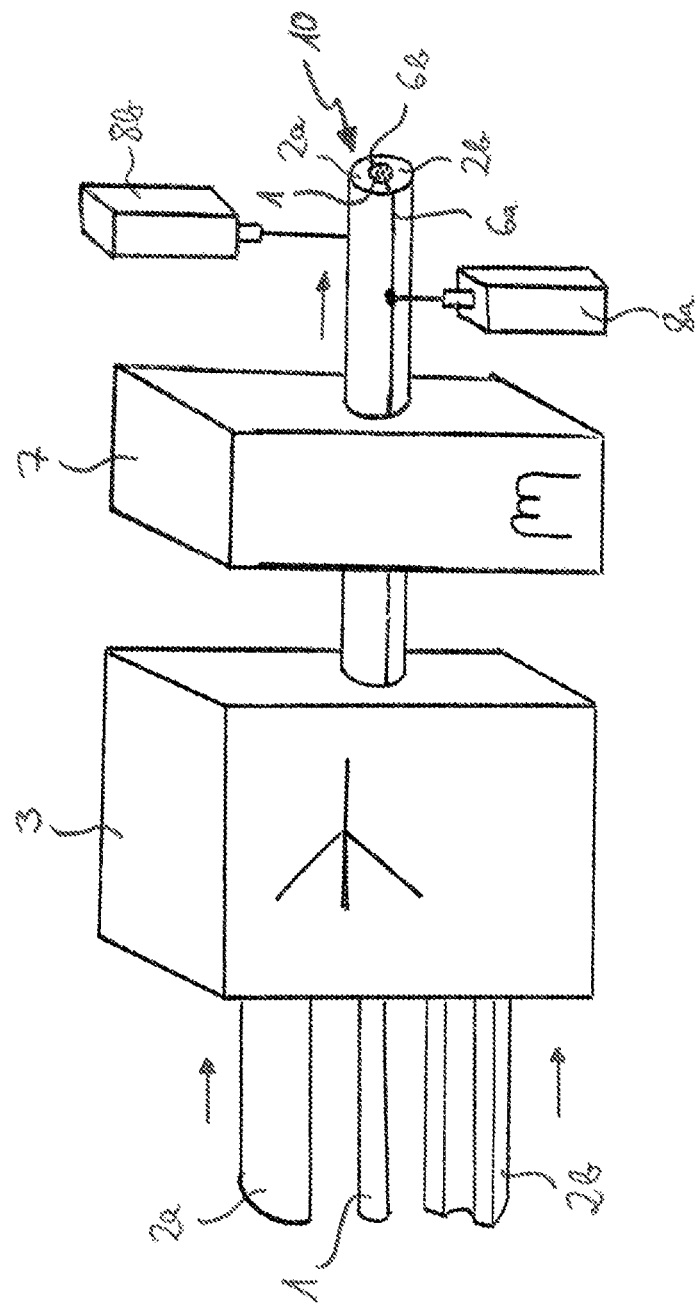
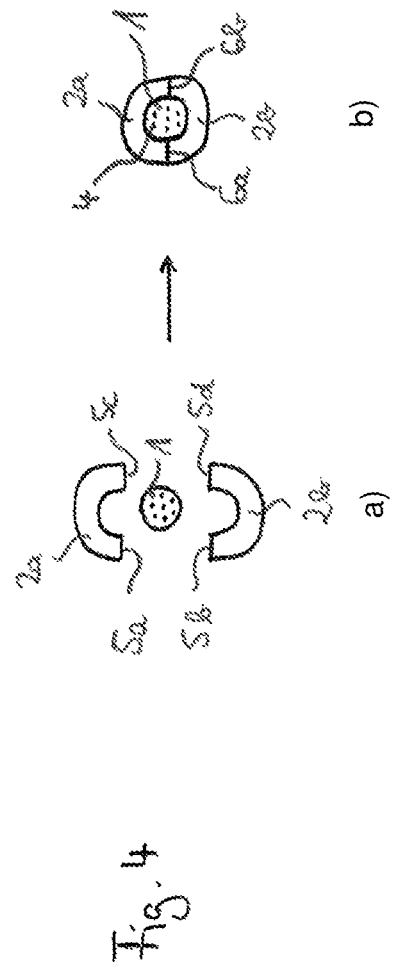
Fig. 3
Fig. 4

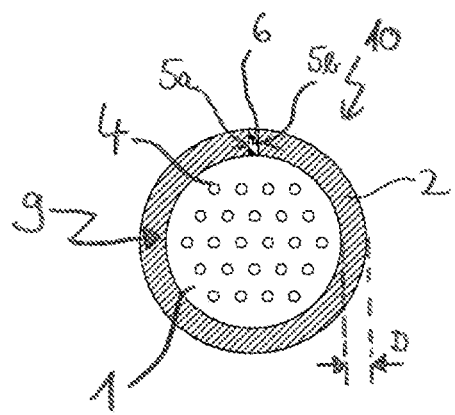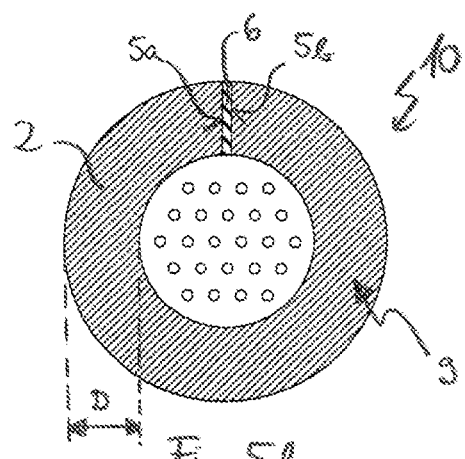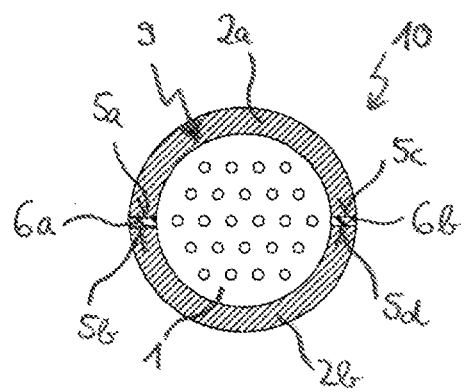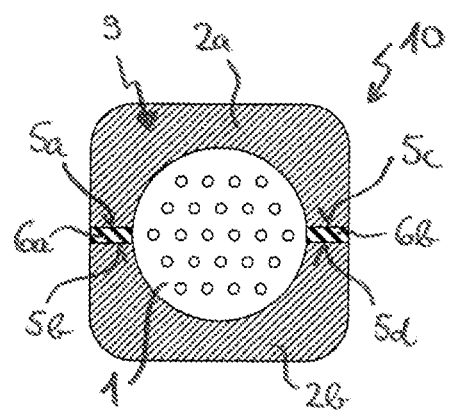

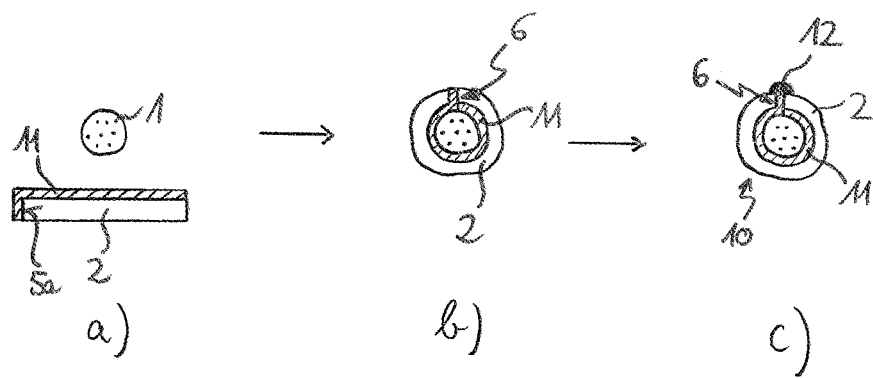
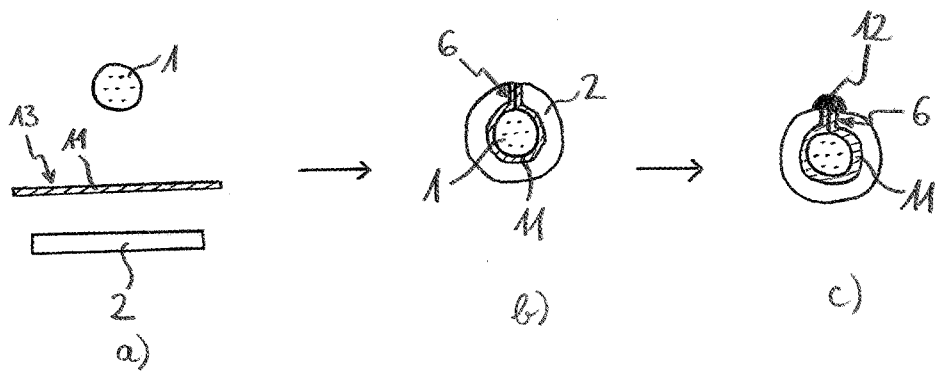
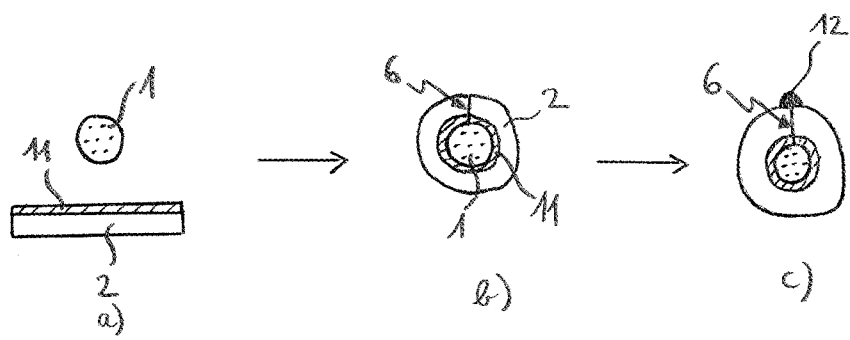
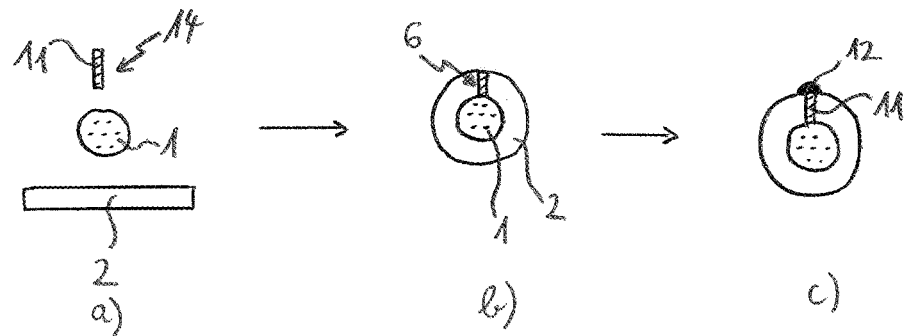

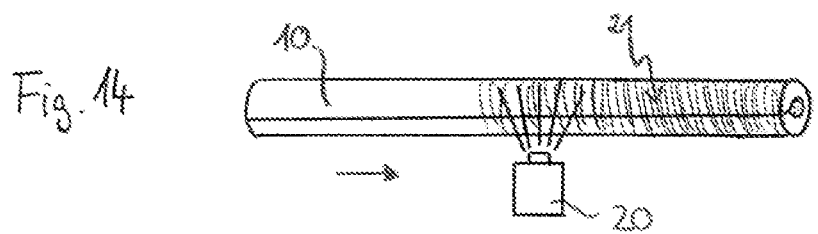

METHOD FOR PRODUCING A SUPERCONDUCTING WIRE, IN PARTICULAR USING LEAD-FREE SOLDER

This application claims Paris convention priority of DE 10 2012 218 250.0 filed Oct. 5, 2012, the entire disclosure of which is hereby incorporated by reference.

BACKGROUND OF THE INVENTION

The invention relates to a method for producing a superconducting wire, wherein an internal wire, which contains superconducting filaments, is provided with a normally conducting stabilizing structure.

Such a method is used for the production of NbTi superconducting wires of the type "Wire in Channel," cf. for example, the Bruker publication "NbTi for MRI application," page 1 of file "NbTi wires.pdf," which can be downloaded from http://www.bruker-est.com/low-temperature-supercons.html dated Jan. 10, 2012.

Superconductors can carry electrical currents practically without ohmic losses. Superconducting wires that contain superconducting filaments are widely used, particularly in power cables and magnet coils; frequently used metallic superconducting materials are, in particular, NbTi and $Nb_3Sn$.

Superconductivity is limited, among other factors, by a critical temperature and a critical current; both values differ from material to material. If the critical temperature or the critical current is exceeded a sudden loss of superconductivity occurs in the superconducting wire ("quench"). The electrical resistance increases significantly, which results in a considerable temperature rise due to the ohmic losses that now start to occur; this temperature rise can damage the superconducting wire.

In a superconducting wire, it is therefore usual to provide a normally conducting current path having a sufficient diameter and parallel to the superconducting filaments, which, if a quench occurs, will carry the current previously conducted by the superconducting wire and thus reduce or further distribute the local temperature rise. The normally conducting current path is also termed "stabilizing"; elementary copper is most frequently used for stabilization.

The most common production processes used for superconducting wires, for example, with NbTi filaments, are based on extrusion and drawing techniques, in which copper matrix material or a copper enclosing tube is deformed together with a superconducting material or prior stages thereof, usually processed as rods or semi-finished products; if necessary, a number of bundles and drawing steps can be combined. In these techniques, the copper component in the drawn superconducting wire is usually defined by the billet structure, material characteristic values/stress states during extrusion and drawing of composites (core breakage problems). In the case of large wire lengths, in particular, sufficient stabilization can usually not be achieved just with the drawn wire if conventional drawing methods are used.

For long wires stabilized with large quantities of copper, as are required, for example, in medical engineering, providing an internal wire containing superconducting filaments with a stabilizing structure made of copper is known as part of the "wire in channel" (=WIC) technique already mentioned. Here, the stabilizing structure consists of a copper wire having an almost rectangular cross section and having a groove (the channel) for holding the internal wire along one of the long sides of the rectangular cross section. To ensure good electrical contact and good mechanical support of the internal wire, the internal wire and the stabilizing structure are pulled through a liquid solder containing tin. Superconducting wires produced by means of "wire in channel" can only be deformed within narrow limits after production, which excludes certain applications, in particular, those for which circular superconducting wire cross sections are required. Likewise, superconducting wires with a large width-to-height ratio cannot be rolled from a WIC superconducting wire.

Another drawback of WIC technology is the lead usually contained in the solder containing tin. This is poisonous to humans (and many other organisms) and is therefore undesirable for environmental reasons. Although lead-free solders are known, they are unfortunately subject to the so-called "tin pest" in which beta-Sn transforms to alpha-Sin, which is accompanied by an increase in volume and causes solder seams to deteriorate after a certain time.

The object of the invention is to provide a method for producing a superconducting wire, which restricts the cross section of the superconducting wire less and which permits the use of lead-free solder.

SUMMARY OF THE INVENTION

This object is achieved with a method of the type mentioned in the introduction, which is characterized in that, in a continuous or quasi-continuous process, one or more sheath elements are shaped and/or placed around the internal wire so that the entire circumference of the internal wire is enclosed by one or more sheath elements, and all seams of sheath element ends facing each other are soldered and/or welded.

The enclosing sheath element(s) form(s) the stabilizing structure of the internal wire. The invention proposes completely enclosing the internal wire (around the entire circumference of the internal wire) with one or more sheath elements. This avoids the groove that occurs in the stabilizing structure when the WIC technique is used. In particular, the internal wire can be inserted centrally in the stabilizing structure, which allows for great freedom with subsequent reshaping (for example, rolling); weaknesses resulting from manufacturing as they occur, for example, in the region of the exposed side of the internal wire in WIC are avoided.

The contact surfaces between the internal wire and the sheath element(s) are essentially sealed, which minimizes the risk of occurrence and spread of in pest when using lead-free solder containing in on these contact surfaces. Tin pest and whisker formation as a rule originates on a free surface; according to the invention, it is precisely the contact surfaces between the internal wire and the sheath elements that are not free. This method is therefore especially suitable when using lead-free solder containing in on these contact surfaces. In principle, mutual contact but without solder is also conceivable.

Irrespective of whether or not solder is used, within the scope of the invention, internal wire external surfaces and sheath element internal surfaces can be cleaned (in particular, degreased) before reciprocal contacting and/or mechanically prepared and/or chemically prepared (in particular, etched, for example, in an HCl bath), in order to create an electrical and mechanical connection that is good enough to permanently ensure the stabilizing function. In particular, when solder is not used, it is advantageous if, as part of the continuous or quasi-continuous process, an at least slight plastic deformation of the internal wire and/or the sheath element(s) close to the surface occurs, so that the surface contours facing each other approximately match. Similarly, the sheath element ends facing each other can be cleaned (in particular, degreased) before soldering and/or welding and/or mechanically prepared and/or chemically prepared (in particular, etched, for example, in an HCl bath), to permit a permanently stable solder or welded seam.

The stabilizing structure can, in particular, be approximately annular in shape, which considerably simplifies the subsequent further processing of the superconducting wire because a particular orientation of the superconducting wire is then usually no longer necessary.

The internal wire comprises, for example (and preferably), NbTi filaments in a copper matrix. But other materials, such as, for example, NbTa filaments and a bronze matrix, can also be used.

According to the invention, it is possible merely to place and shape a sheath element around the internal wire; in this case, a degree of plastic deformation of the sheath element is necessary when it is placed around the internal wire. If only one sheath element is used there is only one seam. Technologies and machines known from the production of copper-clad aluminum or steel wires (CCA copper-clad aluminum; CCS copper-clad steel) can be used to shape the sheath element.

It is also possible to clad the wire with a plurality of sheath elements (usually two); in this case, plastic deformation of the sheath element is no longer necessary when it is placed around the internal wire; however, plastic deformation is possible if desired. If two sheath elements are used, there are two seams, and correspondingly more if there are more sheath elements.

By subsequently placing the stabilizing structure around the internal wire, a relatively free or variable choice of cross-section portion for the stabilizing structure is possible (particularly with respect to the thickness of the sheath element(s) to be shaped or placed around the internal wire). The mechanical and electrical properties of the superconducting wire can be implemented accordingly via the quantity (thickness) of the sheath material. In particular, a higher degree of stabilization that is sufficient for medical applications can easily be implemented.

In an especially preferred variant of the inventive method, one or more sheath elements are chosen and shaped and/or placed around the internal wire in the continuous or quasi-continuous process in such a way that all seams of the sheath element ends facing each other extend, seen in cross section, at least in sections, obliquely with respect to the local internal wire surface and obliquely with respect to the local sheath element surface. In this variant, a seam is chosen that is longer in cross section than the local thickness of the sheath element(s) (in the region of the seam) would require. In this way, the heat input arising from welding at the outermost end of the seam would be distributed along a greater length and thus a larger region around the seam. Chiefly along the seam, the heat penetrates into the recently manufactured superconducting wire, in particular, if the seam has been provided with a solder containing tin. A temperature peak can impair the superconducting properties of the filaments in the internal wire ("damage"). Further distribution of the heat thus contributes to the protection of the filaments. Sheath elements with side edges that are, seen in cross section, oblique are typically used for the production of oblique seams. The seam can, for example, run tangentially to the inside and/or outside interface of the sheath element(s); a hyperbolic shape is also possible.

In an advantageous further development of this variant, each seam which, at least in sections, is oblique with respect to the local internal wire surface and oblique with respect to the local sheath element surface is, seen in cross section, at least twice as long as the thickness of the sheath element ends perpendicular to the surface of the sheath element ends. In practice, this has resulted in good protection of the superconducting filaments in the internal wire.

A variant is also preferred in which, as seen in cross section, the sheath element ends at the outer end of each seam are welded to each other, in particular by laser welding. By welding, particularly strong seams can be produced. In laser welding, the heat input is especially low compared with other welding techniques, thus protecting the superconducting filaments, which can be damaged by temperature peaks.

In an especially preferred variant of the method, a non-twisted internal wire is used in the continuous or quasi-continuous process in such a way that all seams are parallel to the superconducting filaments of the internal wire, and that the superconducting wire is twisted after the internal wire has been provided with the stabilizing structure. If a few of the superconducting filaments in the internal wire are damaged as the result of heat input along the seam when they are welded to apply the stabilizing structure, the same superconducting filaments are always damaged throughout the welding process. The remaining filaments of the internal wire remain undamaged so that the current-carrying capacity is only slightly reduced.

A variant of the method is also preferred in which, as part of the continuous or quasi-continuous process, a solid solder containing in is inserted between the sheath element(s) and the internal wire, especially wherein the solid solder containing in is lead-free, and that shaping and/or placing the sheath element(s) around the internal wire is followed by heat treatment, which melts the solder containing tin. With this procedure, it is possible to solder the contact surfaces of the internal wire and the sheath element or sheath elements inside the superconducting wire; in particular, it is not necessary to pull it through a solder bath. Free solder surfaces, from which in pest could start, are avoided. Penetration of in pest via the seam is not to be expected because, in any case, the solder composition in the vicinity of the seam usually differs from the composition further inside (for example, as a result of alloying processes with the ends of the sheath elements), which prevents in pest; it is also possible to deliberately implement a different solder composition in the vicinity of the seam to prevent the propagation of in pest through the seam (possibly to the detriment of the electrical conductivity, which is not that important in the vicinity of the seam). In the simplest case, the sheath element ends at the outermost end of the seam are welded so that the soldered regions are sealed by sheath element material (usually copper) and, by that means alone, the penetration of in pest is prevented.

In an advantageous further development of this variant, one or more sheath elements that are used in the continuous or quasi-continuous process are coated with solder containing in on their side facing the internal wire. In this case, the application of the solder does not affect the placing and/or shaping of the sheath element(s) around the internal wire, so that processing can be kept particularly simple.

In a further development of the variant of the method stated above, a foil made of a solder containing in is placed between the sheath element(s) and the internal wire before or while the sheath element(s) are shaped and/or placed around the internal wire. In this case, the sheath element(s) do not have to be coated with the solder beforehand.

In another variant of the method, during the continuous or quasi-continuous process, a solid solder containing in is inserted between the sheath element ends, in particular, wherein the solid solder containing in is lead-free, and, after shaping and/or placing the sheath element(s) around the internal wire, a heat treatment is performed by which the solder containing in is melted on, especially wherein one or more sheath elements used in the continuous or quasi-continuous process are coated, at least on one part of their sheath element ends, with a solder containing tin, and/or wherein before or during shaping and/or placing the sheath element(s) around the internal wire, a foil made of solder containing in is inserted between the sheath element ends. By this method, it is possible to solder the sheath element ends facing each other without having to pull them through a solder bath. Free solder surfaces from which in pest could start, are thereby avoided. The penetration of in pest via the seam is not to be expected because, in any case, the solder composition in the vicinity of the seam usually differs from compositions susceptible to in pest (for example, as the result of alloying processes with the ends of the sheath elements); it is also possible to deliberately implement a different solder composition in the vicinity of the seam in order to prevent the propagation of in pest through the seam (possibly to the detriment of the electrical conductivity, which is not that important in the vicinity of the seam). In the simplest case, the sheath element ends at the outermost end of the seam are welded so that the soldered regions are sealed by sheath element material (usually copper) and the penetration of in pest is prevented by that means alone.

In an especially preferred variant, only one sheath element is used in the continuous or quasi-continuous process and the sheath element is shaped around the internal wire. This variant is mainly used for thin stabilizing structures, with which plastic deformation can be achieved well and easily. Mainly, flat, or U-shaped preshaped sheath elements are used. Furthermore, only two items (internal wire and one sheath element) have to be processed.

Equally preferred is a variant of the method in which two sheath elements preshaped as half-shells are used in the continuous or quasi-continuous process, and that the half-shells are placed around the internal wire. In this variant, no plastic deformation of the sheath elements is required, which makes execution of the method simple in this respect. In this variant, solder is usually inserted inside the superconducting wire (see above). The half-shells can, for example, have a circular exterior cross section or an almost semi-cuboidal exterior cross section. The interior cross section of the half-shells is adapted to the (usually circular) exterior cross section of the internal wire.

In an advantageous variant of the method, the superconducting wire is subjected to a reshaping or drawing process after the internal wire has been provided with the stabilizing structure. In this way, the superconducting wire can be adapted to specific application without any necessity to modify the cladding process.

In an advantageous further development of this variant, the reshaping or drawing process ensures that an almost rectangular or almost circular cross section can be implemented. Wires with a rectangular cross section can more easily absorb forces perpendicular to their flat outer sides. A circular exterior cross section permits simple subsequent handling, in which little or no attention has to be paid to the rotational orientation of the wire.

A method is also advantageous in which the superconducting wire is coated with an electrically insulating paint after the internal wire has been provided with the stabilizing structure. With the inventive method, exterior cross sections can be implemented that are highly suitable for painting, for example, with relatively large radii of curvature on all sides, which permit good wetting and low abrasion, including a circular exterior cross section of the superconducting wire.

In a preferred variant of the method, the sheath element(s) are produced from copper, steel, aluminum, or alloys of copper, iron, and/or aluminum. These materials or elements have proven particular suitable for the stabilization function in terms of their mechanical, electrical, and/or thermal properties.

The scope of this invention also includes a superconducting wire, comprising an internal wire, which contains superconducting filaments, and a normally conducting stabilizing structure,
which is characterized in that
the stabilizing structure encloses the internal wire around its entire circumference, wherein the stabilizing structure comprises one or more sheath elements,
and that all seams of the sheath element ends facing each other are soldered and/or welded,
wherein the superconducting wire has one or more seams that extend along the entire length of the superconducting wire,
in particular, wherein the superconducting wire is produced by one of the inventive methods above. Such a wire can be provided with a stabilizing structure, irrespective of the manufacturing restrictions of the internal wire, which permits a wide range of subsequent reshaping processes; this superconducting wire is thus particularly widely applicable and flexibly adaptable. It is also well suited to the use of lead-free solders because soldered regions are usually essentially covered by the sheath element(s).

In a highly preferred embodiment of the inventive superconducting wire, all seams of sheath element ends facing each other extend, seen in cross section, at least in sections, obliquely with respect to the local internal wire surface and obliquely with respect to the local sheath element surface. In this way, heat input due to welding at the outer end of the seam is further distributed, thus avoiding damage to the superconducting filaments in the internal wire.

A variant is especially preferred in which, as seen in cross section, the sheath element ends at the outer end of each seam are welded to each other. On the one hand, this makes the seam particular stable and on the other hand the inside of the superconducting wire is permanently sealed so that oxygen can no longer penetrate. Internal lead-free solder containing in is reliably protected from in pest.

In an advantageous embodiment, a solder containing tin, in particular, a lead-free solder containing tin, is disposed between the internal wire and the sheath element(s) and/or between the sheath element ends facing each other. The solder improves the mechanical and especially the electrical contact between the internal wire and the stabilizing structure and/or at the seams. The lead-free solder is particularly environmentally friendly and, because of the structure of the superconducting wire, the latter can be protected from in pest.

Finally, another embodiment is preferred in which the stabilizing structure comprises two sheath elements, which are soldered and/or welded to each other with two seams. In this case, it is particularly easy to choose a cross section of the superconducting wire flexibly.

Further advantages result from the description and the drawing. Moreover, the features stated above and further below can be used singly or together in any combination. The embodiments shown and described are not intended to be an exhaustive list, rather are examples to explain the invention.

The invention is shown in the drawing and is explained in more detail using the example of the embodiments. The figures show:

BRIEF DESCRIPTION OF THE DRAWING

FIG. 1 a schematic side view of a production line in which a superconducting wire is produced according to the invention, wherein a sheath element is shaped around an internal wire;

FIG. 2 various cross sections of the internal wire and of the sheath element of FIG. 1 during the shaping process;

FIG. 3 a schematic side view of a production line on which a superconducting wire is produced according to the invention, wherein two half-shell-shaped sheath elements are placed around an internal wire;

FIG. 4 various cross sections of the internal wire and of the sheath elements of FIG. 3 during the placement process;

FIG. 5a-5d various cross sections of inventive superconducting wires;

FIG. 6 a schematic overview of the production of a superconducting wire within the scope of the invention, with a sheath element tin-coated on its long and short sides;

FIG. 7 a schematic overview of the production of a superconducting wire within the scope of the invention, with an inserted in foil, which overlaps the long side of the sheath element on both sides;

FIG. 8 a schematic overview of the production of a superconducting wire within the scope of the invention, with a sheath element tin-coated on its long side only;

FIG. 9 a schematic overview of the production of a superconducting wire within the scope of the invention, with a in foil inserted between the sheath element ends;

FIG. 14 a schematic representation for the subsequent painting of a superconducting wire within the scope of the invention.

DESCRIPTION OF THE PREFERRED EMBODIMENT

Figure 10:
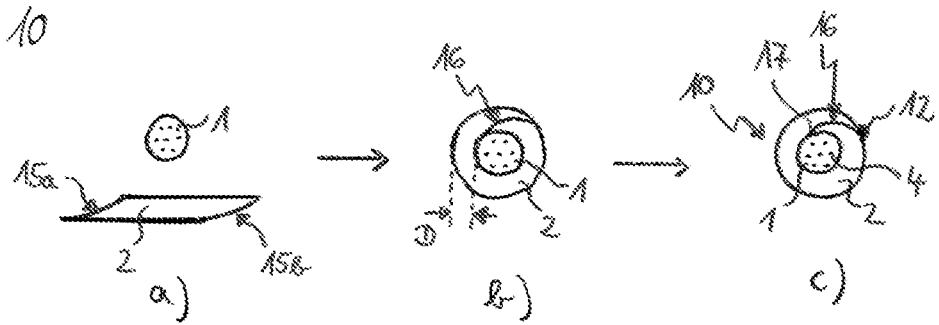
FIG. 10 a schematic overview for the production of a superconducting wire within the scope of the invention with an oblique seam.

In a schematic representation, FIG. 1 shows the production of a superconducting wire within the scope of the invention in a first variant.

An internal wire 1, circular in this case, which contains superconducting filaments (for example, made of NbTi), and a sheath element 2 (for example, made of copper), which is flat before being preshaped, is continuously fed into a shaping tool 3, and/or drawn through it, wherein the sheath element 2 is plastically deformed.

The sheath element 2 is initially moved toward the internal conductor 1 and then wrapped around the internal conductor 1, cf. FIGS. 2 a) to e), which explain the chronological sequence of the process in the shaping tool 3 in more detail by means of cross section representations. The cross section representations also show the superconducting filaments 4 in the internal wire 1. The two sheath element ends 5a, 5b are then, by plastic deformation, brought into a position in which they are facing each other and in which they typically abut, possibly also via interposed materials such as a solder, and the internal wire 1 is practically completely enclosed by the sheath element 2. The sheath element ends 5a, 5b facing each other constitute a seam 6.

For mechanical stabilization, this is then typically followed by heating, for example, in an electric oven 7, in order to melt on a solder, which is disposed between the internal wire 1 and the enclosing sheath element 2, or which is also disposed in the seam 6 (for how the solder is introduced see, in particular, FIGS. 6 to 9). Alternatively or (preferably) additionally, the seam 6 is welded, here with a laser welding device 8. If desired or required, a cooling stage can be provided between oven 7 and the laser welding device 8. The welded seam 6 seals the inside of the completed superconducting wire 10 in such a way that it is protected from unwanted environmental influences.

An alternative variant for producing a superconducting wire within the scope of the invention is illustrated in FIG. 3.

Here, the shaping tool 3 is continuously fed with the internal wire 1 and two sheath elements 2a, 2b preshaped as half-shells.

The sheath elements 2a, 2b and the internal wire 1 are combined in the shaping tool 3, as is shown in FIGS. 4 a) and b), which also explain the chronological sequence of the process in shaping tool 3 in more detail by means of cross-section representations. If desired, (typically slight) plastic deformation of the sheath elements 2a, 2b can also be performed here. The half-shell-shaped sheath elements 2a, 2b then practically completely surround the internal wire 1, wherein the sheath element ends 5a, 5b, 5c, 5d facing each other constitute two seams 6a, 6b. Typically, the sheath element ends 5a, 5b and 5c, 5d facing each other contact each other, possibly also via interposed materials such as a solder.

For mechanical stabilization purposes, this is then typically followed again by heating, for example, in an electric oven 7, in order to melt on a solder, which is disposed between the internal wire 1 and the enclosing sheath elements 2a, 2b, or which is also disposed in the seams 6a, 6b (for how the solder is introduced see, in particular, FIGS. 6 to 9). Alternatively or (preferably) additionally, the seams 6a, 6b are welded, in this case with two laser welding devices 8a, 8b. If desired or necessary, a cooling stage can be provided between the oven 7 and the first laser welding device 8a. The welded seams 6a, 6b seal the inside of the completed superconducting wire 10 so that it is protected from unwanted environmental influences.

In FIGS. 5a to 5d, various embodiments of inventive superconducting wires 10 are explained in cross section.

In all four cases, an equally sized, circular internal wire 1, here with 24 superconducting filaments 4, is disposed centrally in the superconducting wire 10. The internal wire 1 is surrounded, in each case, practically around its entire circumference by a stabilizing structure 9, for instance made of elementary copper 10.

In the embodiments of 5a and 5b, the stabilizing structure 9 comprises only one sheath element 2 in each case, wherein the ends 5a, 5b facing each other constitute a seam 6. Depending on the desired application for the superconducting wire 10, a suitable thickness D of the sheath element 2 can be chosen in order to be able to implement the desired degree of stabilization and/or to achieve a desired weight per unit length or similar objectives.

The stabilizing structure 9 can also be constituted by half-shell-shaped two sheath elements 2a, 2b, as shown in the embodiments of FIGS. 5c and 5d; it is even possible to use three or more sheath elements. The ends 5a, 5b, 5c, 5d facing each other also constitute seams 6a, 6b. By choosing suitable cross-section shapes, including absolute dimensions, of the sheath elements 2a, 2b, these can be adapted to the desired application of superconducting wire 10. In particular, not only circular exterior cross sections, cf. FIG. 5c, but also rectangular or almost rectangular cross-sectional shapes, cf. FIG. 5d, can be chosen. Such a choice is never restricted by plastic deformation processes as part of the enclosing process (cf. FIGS. 1 to 4) because the half-shell-shaped sheath elements 2a, 2b can be placed without plastic deformation.

FIGS. 6 to 9 shows different possible ways of including a solder, in particular a lead-free solder containing tin, in the production process according to the invention. A solder (that is usually based on in but could also be tin-free) can improve the mechanical strength and electrical contact inside the superconducting wire, in particular, between the stabilizing structure and the internal wire, but also between the sheath element ends. In the interests of simplicity, a variant with only one sheath element is depicted in each figure, however, all the variants shown could just as well be used with a plurality of sheath elements. Each figures shows production of superconducting wire, starting from the unclad initial parts a) through joining b) to the completed, welded superconducting wire c).

In the variant shown in FIG. 6, solder 11 is to be placed both around internal wire 1 and into the seam 6. To achieve this, the sheath element 2 is first coated with (solid) solder 11 both along its long side (facing toward the internal wire 1) and also along its short side, that is, on a sheath element end 5a. This is done by locally applying the solder 11 at a specific location, using a brush or similar tool and, at the beginning of the combining process, shown in a), the solder 11 is solid (or dry). When the internal wire 1 and the sheath part 2 are combined b), the solder 11 is then automatically correctly placed and, in particular, there is no solder at unwanted positions, for example, over large surfaces on the external side of the sheath element 2, which would be practically unavoidable with a solder bath. The final welding c) at the top end of the seam 6 seals the outside (here, upper) edge of the solder 11, cf. the weld bead 12, so that it cannot be a starting point for tin pest.

In the variant of FIG. 7, a foil made of solder 11 is inserted between the sheath element 2 and the internal wire 1. Because foil 13 projects beyond the edges of the sheath element 2, cf. a), solder 11 is not only placed around the internal wire 1, but also into the seam 6. Here, the foil projects on both sides, so that two foil thickness of solder 11 are disposed in the seam 6, cf. b); a projection on one side only would suffice for a single foil thickness of solder 11 in the seam 6. By welding, the upper edge of the solder 11 can be sealed in the seam 6, cf. the weld bead 12 in c). By using foil 13, prior coating of the sheath element 2 can be avoided.

If it is desired that solder 11 only be placed around internal wire 1, coating of the sheath element 2 can be limited to the long side of the sheath element 2 facing the internal wire 1, as is shown in FIG. 8, in particular a). In this case, the seam 6 remains solder-free, see b). Sealing the seam 6 by welding is usually not necessary to prevent in pest and can therefore be omitted. Nevertheless, the seam 6 can be welded in order to improve mechanical stability and achieve additional protection from in pest, cf. c).

In certain cases, it might also be desirable to only solder the seam 6. To achieve this, for example, a short piece of foil 14 made of solder 11 could merely be inserted into seam 6, cf. FIG. 9, especially a). After combining, no solder is then disposed around the internal wire 1, cf. b). In this case, however, welding is recommended in order to seal the upper edge of the solder 11 with the weld bead 12.

It should be noted that, in practice, the weld bead 12 does not necessarily have to project noticeably beyond the stabilizing structure or the sheath element; in FIGS. 6 to 9 it has been exaggerated for better understanding. The weld bead is typically flush with the seam, i.e., integrated into it. The composition of the weld bead is approximately the same as the composition of the adjacent sheath element 2, wherein additives can be used (for example, to reduce the melt temperature) and contamination from adjacent material can also occur.

In FIG. 10, cross-section representations illustrate the production sequence of a superconducting wire 10 according to the invention, wherein a sheath element 2 is used having sheath element ends 15a, 15b that are oblique to the long sides (or least to the adjacent parts of the long sides) of sheath element 2, cf. a). After combining, illustrated in b), an oblique (non-perpendicular) seam 16 is formed, both with respect to the local parts (adjacent to the seam) of the outer side of internal wire 1 and with respect to the local parts (adjacent to the seam) of the outer side of the sheath element 2. In the example shown, the seam 16 is also slightly curved within itself.

The oblique shape makes the seam 16 considerably longer (here, approximately twice as long) than is required to surround the internal wire 1. The shortest possible seam (extending perpendicularly with respect to the outer side of the sheath element 2; "radial seam" or "perpendicular seam") would be approximately as long as the thickness D of the sheath element 2; the seam 16 has a length of approx. 2×D.

This causes the heat input due to welding at the outer end of the seam 16, cf. the weld bead 12 in c) to be distributed along a relatively long distance because, in the inventor's experience, the input heat propagates most quickly along seam 16 (especially if the latter contains solder), but less quickly through the sheath element 2. Accordingly, the peak temperature reached at the inner end 17 of the seam 16 is considerably lower than for a short seam. Superconducting filaments 4, which can be slightly degraded by high temperatures, are thus better protected from thermal damage during production of the superconducting wire 10.

Figure 11:
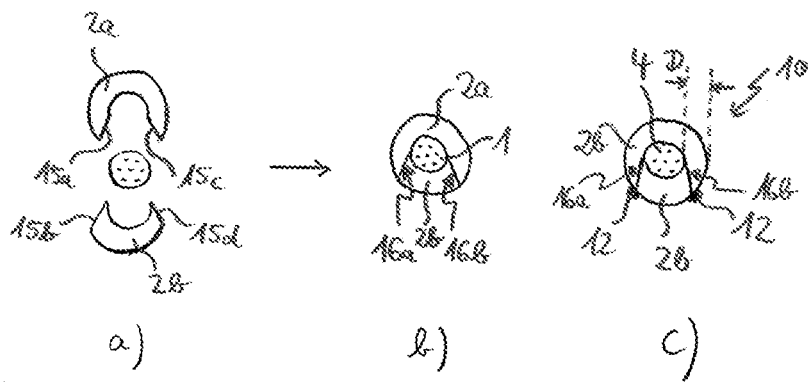
FIG. 11 a schematic overview of the production of a superconducting wire within the scope of the invention with two half-shell-shaped sheath elements with oblique seams.
Figure 12:
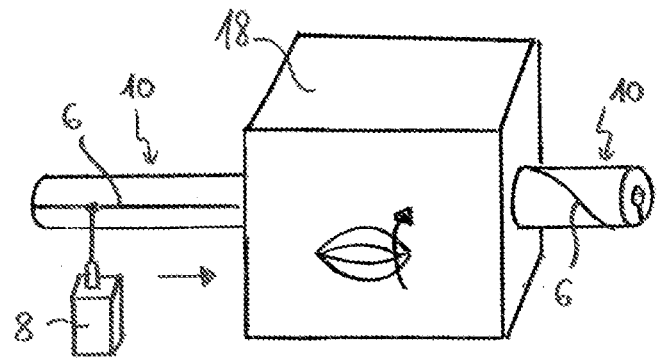
FIG. 12 a schematic representation of the subsequent twisting of a superconducting wire within the scope of the invention.

Oblique sheath element end regions 15a, 15b, 15c, 15d can also be used with two sheath elements 2a, 2b, cf. the cross-sectional representations of FIG. 11. Oblique seams 16a, 16b then result, which are also considerably longer than the shortest possible seams, which would be perpendicular to the local outer sides (surfaces) of the internal wire 1 and the sheath elements 2, cf. after assembly under b). As a result, the heat input, starting from the outer ends of the seams 16a, 16b, see weld bead 12, is better distributed within the superconducting wire 10. Please note that the outer ends of the seams 16a, 16b should be clearly spaced in the circumferential direction so that there is no noticeable or even harmful addition of heat input in the region of the superconducting filaments 4. Spacing is usually sufficient if the distance is at least twice the thickness D of the sheath elements 2a, 2b Within the scope of the invention, assembly and soldering and/or welding of the seams of a superconducting wire can be followed by further measures, which are presented in FIGS. 12 to 14.

It is especially advantageous if, within the scope of the invention, a non-twisted (not twisted within itself) internal wire is integrated so that up to and including the time when the seam or seams is/are welded, the superconducting filaments extend parallel to the seam or seams. Should a small part of the superconducting filaments in the vicinity of the inside end of a seam become damaged by welding, this damage will always affect the same filaments along the entire length of the internal wire, which will usually only result in a slight loss of superconductivity. In order to nevertheless benefit from the advantages of twisting (especially from the decoupling of the filaments), the superconducting wire should be twisted again after welding, cf. in FIG. 12 the schematically represented twisting unit 18 behind the welding device 8. After twisting, the resulting superconducting wire 10 has one or more helically winding seams 6.

Figure 13:
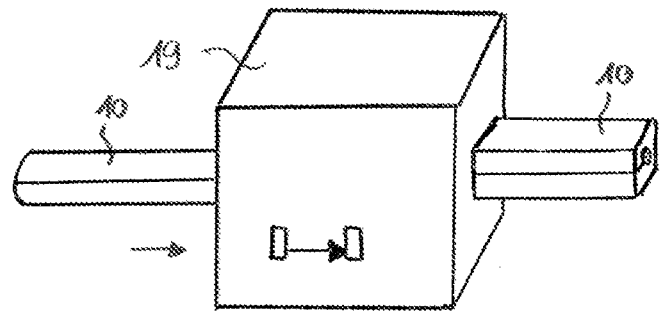
FIG. 13 a schematic representation of the subsequent reshaping of the cross section of a superconducting wire within the scope of the invention.

It is also possible to subsequently subject an inventive superconducting wire to a reshaping process, cf. FIG. 13. For example, a rectangular exterior cross section having an equal or smaller area can be imposed upon a circular superconducting wire 10 in a reshaping unit 19.

Finally, an inventive superconducting wire 10 can also be subsequently treated with a paint 21, for example, an electrically insulating paint, for which the superconducting wire 10 can be continuously moved through a painting unit 20, as shown in FIG. 14.

We claim:

1. A superconducting wire comprising:
    an internal wire containing superconducting filaments;
    a normally conducting stabilizing structure, said stabilizing structure enclosing said internal wire around an entire circumference thereof, wherein said stabilizing structure has one or more sheath elements having mutually opposite sheath element ends; and
    at least one welded or soldered seam disposed between and connecting together each of said mutually opposite sheath element ends, with at least one said seam extending along an entire length of the superconducting wire, wherein, seen in cross section, all seams of said sheath element ends facing each other extend obliquely with respect to a local internal wire surface and obliquely with respect to a local sheath element surface through a length which is greater than a thickness of the sheath element ends perpendicular to a surface of the sheath element ends, said length thereby being selected to reduce or prevent damage to said superconducting filaments due to heat development generated during welding or soldering of said seams.

2. The wire of claim 1, wherein the superconducting wire is coated with an electrically insulating paint after the internal wire has been provided with the stabilizing structure.

3. The wire of claim 1, wherein the sheath elements are made of copper, steel or aluminum or of alloys of copper, iron and/or aluminum.

4. The superconducting wire of claim 1, wherein, as seen in cross section, said sheath element ends are welded or laser welded to each other at an outer end of each seam.

5. The superconducting wire of claim 1, wherein a solder containing tin or a lead-free solder containing tin, is disposed between said internal wire and said sheath elements and/or between said sheath element ends facing each other.

6. The superconducting wire of claim 1, wherein said stabilizing structure comprises two sheath elements which are soldered and/or welded to each other with two seams.

7. A method for producing the superconducting wire of claim 1, wherein an internal wire that contains superconducting filaments is provided with a normally conducting stabilizing structure, the method comprising the steps of:
    a) shaping and/or placing, in a continuous or quasi-continuous process, one or more sheath elements around the internal wire, so that an entire circumference of the internal wire is enclosed by the one or more sheath elements; and
    b) soldering and/or welding all seams of sheath element ends which face each other.

8. The method of claim 7, wherein, in the continuous or quasi-continuous process, one or more sheath elements are selected and shaped and/or placed around the internal wire in such a way that, seen in cross section, at least sections of all seams of the sheath element ends facing each other are oblique with respect to a local internal wire surface and oblique with respect a local sheath element surface.

9. The method of claim 8, wherein, seen in cross section, all seams having at least sections that are oblique with respect to the local internal wire surface and oblique with respect to the local sheath element surface are each at least twice as long as a thickness of the sheath element ends perpendicular to a surface of the sheath element ends.

10. The method of claim 7, wherein, as seen in cross section, the sheath element ends are welded to each other at an outer end of each seam or are welded to each other by laser welding at an outer end of each seam.

11. The method of claim 7, wherein a non-twisted internal wire is used in the continuous or quasi-continuous process in such a way that all seams extend parallel to the superconducting filaments of the internal wire and the superconducting wire is subsequently twisted after the internal wire has been provided with the stabilizing structure.

12. The method of claim 7, wherein, as part of the continuous or quasi-continuous process, a solid solder containing tin or a lead-free solid solder containing tin is inserted between the one or more sheath elements and the internal wire and shaping and/or placing the sheath elements around the internal wire is followed by heat treatment, which melts the solder containing tin.

13. The method of claim 12, wherein sheath elements that are used in the continuous or quasi-continuous process are coated with solder containing tin on a side thereof facing the internal wire.

14. The method of claim 12, wherein a foil made of a solder containing tin is placed between the sheath elements and the internal wire before or while the sheath elements are shaped and/or placed around the internal wire.

15. The method of claim 7, wherein, during the continuous or quasi-continuous process, a solid solder containing tin or a solid solder containing lead-free tin is inserted between the sheath element ends and, after shaping and/or placing the sheath elements around the internal wire, a heat treatment is performed by which the solder containing tin is melted or one or more sheath elements used in the continuous or quasi-continuous process is coated, at least on one part of the sheath element ends, with a solder containing tin, and/or before or during shaping and/or placing the sheath elements around the internal wire, a foil made of solder containing tin is inserted between the sheath element ends.

16. The wire of claim 1, wherein only one sheath element is used in a continuous or quasi-continuous process and the sheath element is shaped around the internal wire.

17. The method of claim 7, wherein two sheath elements, preshaped as half-shells, are used in the continuous or quasi-continuous process and the half-shells are placed around the internal wire.

18. The method of claim 7, wherein the superconducting wire is subjected to a reshaping or drawing process after the internal wire has been provided with the stabilizing structure.

19. The method of claim 18, wherein the reshaping or drawing process ensures that an almost rectangular or almost circular cross section of the superconducting wire can be implemented.

* * * * *